United States Patent
Stoek et al.

(10) Patent No.: US 11,101,201 B2
(45) Date of Patent: Aug. 24, 2021

(54) SEMICONDUCTOR PACKAGE HAVING LEADS WITH A NEGATIVE STANDOFF

(71) Applicant: Infineon Technologies AG, Neubiberg (DE)

(72) Inventors: Thomas Stoek, Buxtehude (DE); Dirk Ahlers, Munich (DE); Stefan Macheiner, Kissing (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/289,972

(22) Filed: Mar. 1, 2019

(65) Prior Publication Data
US 2020/0279795 A1    Sep. 3, 2020

(51) Int. Cl.
*H01L 23/495*    (2006.01)
*H01L 23/42*    (2006.01)
*H01L 23/31*    (2006.01)

(52) U.S. Cl.
CPC .... *H01L 23/49555* (2013.01); *H01L 23/3114* (2013.01); *H01L 23/42* (2013.01); *H01L 23/49503* (2013.01); *H01L 23/49562* (2013.01)

(58) Field of Classification Search
CPC ..... H01L 2224/73265; H01L 2924/181; H01L 24/48; H01L 23/49551; H01L 23/49541; H01L 23/49861; H01L 2225/1029; H01L 21/4857; H01L 23/3114; H01L 23/42; H01L 23/49503; H01L 23/49562; H01L 23/49555

USPC ................ 257/666, 675, 676, 787, 796, 707
See application file for complete search history.

(56) References Cited

U.S. PATENT DOCUMENTS

| | | | | |
|---|---|---|---|---|
| 6,559,525 B2* | 5/2003 | Huang | ................ | H01L 23/4334 257/675 |
| 7,193,298 B2* | 3/2007 | Hong | ................ | H01L 23/49541 257/666 |
| 7,795,724 B2* | 9/2010 | Brodsky | ............. | H01L 23/3121 257/712 |
| 7,834,435 B2* | 11/2010 | Chen | ................ | H01L 23/49541 257/676 |
| 9,269,653 B2* | 2/2016 | Chen | ................ | H01L 23/49524 |
| 10,049,969 B1* | 8/2018 | Liu | .................... | H01L 23/49503 |
| 2008/0164586 A1* | 7/2008 | Kim | .................... | H01L 23/3107 257/666 |
| 2009/0160067 A1* | 6/2009 | Bayan | ............... | H01L 23/49541 257/778 |

(Continued)

*Primary Examiner* — Luan C Thai
(74) *Attorney, Agent, or Firm* — Murphy, Bilak & Homiller, PLLC

(57) ABSTRACT

A molded semiconductor package includes a mold compound, a plurality of leads each having a first end embedded in the mold compound and a second end protruding from a side face of the mold compound, and a semiconductor die embedded in the mold compound and electrically connected, within the mold compound, to the plurality of leads. The second end of each lead of the plurality of leads has a bottom surface facing in a same direction as a bottom main surface of the mold compound. The bottom surface of each lead of the plurality of leads is coplanar with the bottom main surface of the mold compound or disposed in a plane above the bottom main surface of the mold compound so that no lead of the plurality of leads extends below the bottom main surface of the mold compound.

16 Claims, 6 Drawing Sheets

(56) References Cited

U.S. PATENT DOCUMENTS

2009/0200660 A1* 8/2009 Awad ................ H01L 23/3675
                                                    257/704
2017/0178928 A1* 6/2017 Williams ............ H01L 23/4952
2018/0096922 A1* 4/2018 Chen ..................... H01L 24/73

* cited by examiner

SEMICONDUCTOR PACKAGE HAVING LEADS WITH A NEGATIVE STANDOFF

BACKGROUND

Leaded semiconductor packages such as DSO (dual small out-line), QFP (quad flat package), SOP (small-outline package) such as SSOP (shrink small-outline package) and TSOP (thin SOP), etc. typically have a positive standoff, i.e., a distance in a range of about 0 to 200 µm between the bottom of the molded package body and the bottom of the package leads so that the leads are in the same plane or a lower plane as the bottom of the molded package body. The positive standoff tolerance is related to the bending process of the leads. The tolerance of the overall package height, including the positive stand-off tolerance of the leads which can range up to about 200 µm, is typically about 300 µm or even greater, e.g., in the case of DSO leaded packages. For top-side cooling applications, the total height tolerance of the package is conventionally compensated by increasing the thickness of a thermal interface material which is used to thermally contact the topside of the molded package body to the bottom side of a cooling area such as a housing which encloses the semiconductor package on a circuit board. However, using a thicker thermal interface material increases the thermal resistance of the thermal path between the topside of the molded package body and the cooling area.

Thus, there is a need for an improved molded semiconductor package with a lower overall height tolerance and thus thinner thermal interface material.

SUMMARY

According to an embodiment of a molded semiconductor package, the molded semiconductor package comprises: a mold compound; a plurality of leads, each lead of the plurality of leads having a first end embedded in the mold compound and a second end protruding from a side face of the mold compound; and a semiconductor die embedded in the mold compound and electrically connected, within the mold compound, to the plurality of leads. The second end of each lead of the plurality of leads has a bottom surface facing in a same direction as a bottom main surface of the mold compound. The bottom surface of each lead of the plurality of leads is coplanar with the bottom main surface of the mold compound or disposed in a plane above the bottom main surface of the mold compound so that no lead of the plurality of leads extends below the bottom main surface of the mold compound. In an embodiment, the bottom surface of each lead of the plurality of leads is vertically offset from the bottom main surface of the mold compound by a distance ranging from 0.01 µm to 0.16 µm so that the bottom surface of each lead of the plurality of leads is disposed in a plane above the bottom main surface of the mold compound. Separately or in combination, each lead of the plurality of leads may be bent downward outside the mold compound in a direction of the bottom main surface of the mold compound. Separately or in combination, the second end of a first subset of leads of the plurality of leads may protrude from a first side face of the mold compound and the second end of a second subset of leads of the plurality of leads may protrude from a second side face of the mold compound opposite the first side face. Separately or in combination, a primary thermal path of the molded semiconductor package may include an exposed pad at a top main surface of the mold compound opposite the bottom main surface of the mold compound.

According to an embodiment of a semiconductor assembly, the semiconductor assembly comprises a circuit board, a molded semiconductor package on the circuit board, and a cooling structure. The molded semiconductor package comprises a mold compound having a bottom main surface facing the circuit board and a top main surface opposite the bottom main surface, a plurality of leads, each lead of the plurality of leads having a first end embedded in the mold compound and a second end protruding from a side face of the mold compound and attached to a first main surface of the circuit board, and a semiconductor die embedded in the mold compound and electrically connected, within the mold compound, to the plurality of leads. The second end of each lead of the plurality of leads has a bottom surface facing the circuit board. The bottom surface of each lead of the plurality of leads is coplanar with the bottom main surface of the mold compound or disposed in a plane above the bottom main surface of the mold compound so that no lead of the plurality of leads is positioned closer to the circuit board than the mold compound. The cooling structure is disposed over the top main surface of the mold compound. A thermal interface material fills a gap between the top main surface of the mold compound and the cooling structure. In an embodiment, the second end of each lead of the plurality of leads is attached to the first main surface of the circuit board by solder, and a total height tolerance of the semiconductor assembly includes a height tolerance of the mold compound between the top and bottom main surfaces of the mold compound, a height tolerance of the solder, a height tolerance of the cooling structure, and a height tolerance of the thermal interface material but not a height tolerance of the plurality of leads. Separately or in combination, the bottom main surface of the mold compound may contact the first main surface of the circuit board. Separately or in combination, the bottom surface of each lead of the plurality of leads may be vertically offset from the bottom main surface of the mold compound by a distance ranging from 0.01 µm to 0.16 µm so that the bottom surface of each lead of the plurality of leads is disposed in a plane above the bottom main surface of the mold compound. Separately or in combination, each lead of the plurality of leads may be bent downward outside the mold compound in a direction of the circuit board. Separately or in combination, the second end of a first subset of leads of the plurality of leads may protrude from a first side face of the mold compound and the second end of a second subset of leads of the plurality of leads may protrude from a second side face of the mold compound opposite the first side face. Separately or in combination, a primary thermal path of the semiconductor assembly includes an exposed pad at the top main surface of the mold compound, the thermal interface material and the cooling structure. Separately or in combination, the cooling structure is a housing attached to the first main surface of the circuit board and which encloses the molded semiconductor package on the circuit board. Separately or in combination, the thermal interface material comprises TiN. Separately or in combination, the thermal interface material has a thickness of 100 um or less.

According to another embodiment of a molded semiconductor package, the molded semiconductor package comprises: a mold compound having a top main surface, a bottom main surface opposite the top main surface and a plurality of side faces extending between the top main surface and the bottom main surface; a plurality of leads protruding from one or more side faces of the plurality of side faces of the mold compound; and a semiconductor die embedded in the mold compound and electrically connected, within the mold compound, to the plurality of leads. Each lead of the plurality of leads is bent downward in a direction away from the top main surface and toward the bottom main surface of the mold compound. Each lead of the plurality of leads terminates outside the mold compound in a plane coplanar with the bottom main surface of the mold compound or in a plane above the bottom main surface of the mold compound so that a total height tolerance of the molded semiconductor package includes a height tolerance of the mold compound between the top and bottom main surfaces but not a height tolerance of the plurality of leads. In one embodiment, a bottom surface of each lead of the plurality of leads is vertically offset from the bottom main surface of the mold compound by a distance ranging from 0.01 µm to 0.16 µm so that the bottom surface of each lead of the plurality of leads is disposed in a plane above the bottom main surface of the mold compound. Separately or in combination, a primary thermal path of the molded semiconductor package includes an exposed pad at the top main surface of the mold compound.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a molded semiconductor package that has a negative standoff between the leads and the bottom main surface of the mold compound. That is, each lead of the package terminates outside the mold compound in a plane coplanar with the bottom main surface of the mold compound or in a plane above the bottom main surface of the mold compound. This way, the total height tolerance of the molded semiconductor package includes the height tolerance of the mold compound but not the height tolerance of the leads. Other tolerances which contribute to the total height tolerance of the molded semiconductor package may include solder tolerance, in the case of the leads being attached to a circuit board by solder, and a cooling structure tolerance, in the case of a cooling structure being used to cool the package. Since the leads of the molded semiconductor package have a negative standoff, the height tolerance of the leads is not a factor in determining the thickness of a thermal interface material which thermally contacts the topside of the molded package body to the bottom side of the housing or other type of cooling structure, thereby lowering the overall height tolerance of the package.

Figure 1:
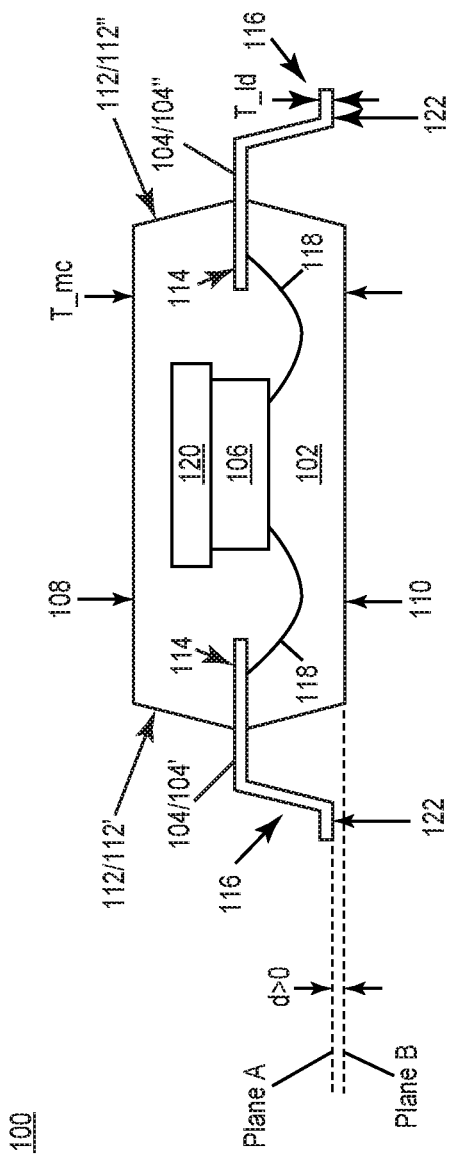
FIG. 1 illustrates a cross-sectional view of an embodiment of a molded semiconductor package of the leaded type and having a negative lead standoff.

FIG. 1 illustrates a cross-sectional view of an embodiment of a molded semiconductor package 100 of the leaded type. The molded semiconductor package 100 includes a mold compound 102, leads 104 and at least one semiconductor die (chip) 106 embedded in the mold compound 102. The mold compound 102 has a top main surface 108, a bottom main surface 110 opposite the top main surface 108 and side faces 112 extending between the top main surface 108 and the bottom main surface 110. Any typical molding process such as injection molding, compression molding, film-assisted molding (FAM), reaction injection molding (RIM), resin transfer molding (RTM), map molding, blow molding, etc. may be used to embed the semiconductor die 106 in the mold compound 102. Common mold compounds and resins include, but are not limited to, thermoset resins, gel elastomers, encapsulants, potting compounds, composites, optical grade materials, etc.

Each lead 104 of the molded semiconductor package 100 has a first end 114 embedded in the mold compound 102 and a second end 116 protruding from a side face 112 of the mold compound 102. Depending on the type of leaded package, the molded semiconductor package 100 may have leads 104 protruding from two, three or all four side faces 112 of the mold compound 102. For example, in the case of a dual row leaded flat package such as SOP like SSO8 or TSOP, a first subset 104' of the leads 104 protrudes from a first side face 112' of the mold compound 102 and a second subset 104" of the leads 104 protrudes from a second side face 112" of the mold compound 102 opposite the first side face 112'. In the case of a quad row leaded flat package such as QFP, the package would further include a third subset (out of view/ not shown) of the leads 104 protruding from a third side face (out of view/not shown) of the mold compound 102 and a fourth subset (out of view/not shown) of the leads 104 protruding from a fourth side face (out of view/not shown) of the mold compound 102.

Regardless of the type of leaded package, the semiconductor die (chip) 106 embedded in the mold compound 102 is electrically connected, within the mold compound 102, to the leads 104. The electrical connections are illustrated as bond wires 118. In general, any type of electrical conductor may be used to electrically connect the semiconductor die 106 to the leads 104 of the package 100. For example, instead of or in addition to bond wires 118, metal clips, metal ribbons, etc. may be used.

The semiconductor die 106 embedded in the mold compound 102 may be attached to a die pad 120 of a lead frame or similar type of structure for supporting the die 106. The leads 104 and the die pad 120 may be formed from the same lead frame, e.g., by stamping or etching. The die pad 120 is the region of a lead frame to which the semiconductor die 106 is attached. More than one semiconductor die 106 may be attached to the same die pad 120 and/or the molded semiconductor package 100 may include more than one lead frame with one or more semiconductor dies 106 attached to each corresponding die pad 120.

In each case, the second end 116 of each lead 104 of the molded semiconductor package 100 has a bottom surface 122 facing in the same direction as the bottom main surface 110 of the mold compound 102. The bottom surface 122 of each lead 104 is coplanar with the bottom main surface 110 of the mold compound 102, or disposed in a plane (Plane A') above the bottom main surface 110 of the mold compound 102. That is, the molded semiconductor package 100 has a negative standoff between the leads 104 and the bottom main surface 110 of the mold compound 102. The term "negative standoff" as used herein means that no lead 104 of the molded semiconductor package 100 extends below the bottom main surface 110 of the mold compound 102.

In one embodiment, each lead 104 of the molded semiconductor package 100 is bent downward in a direction away from the top main surface 108 of the mold compound 102 and toward the bottom main surface 110 of the mold compound 102, e.g., in a gull-wing like configuration, and terminates outside the mold compound 102 in a plane (Plane B') coplanar with the bottom main surface 110 of the mold compound 102 or in a plane (Plane A') above the bottom main surface 110 of the mold compound 102, so that a total height tolerance (T_pkg) of the molded semiconductor package 100 includes a height tolerance (T_mc) of the mold compound 102 between the top and bottom main surfaces 108, 110 but not a height tolerance (T_ld) of the leads 104. The height tolerance T_mc of the mold compound 102 can be controlled precisely, e.g., to 100 µm. The molded semiconductor package embodiments described herein differ from conventional molded semiconductor packages with a positive lead standoff and which typically have a height tolerance of up to 300 µm.

FIG. 1 shows each lead 104 of the molded semiconductor package 100 terminating outside the mold compound 102 in a first plane (Plane A') which is above a second plane (Plane B') in which the bottom main surface 110 of the mold compound 102 lies. The leads 104 themselves may terminate in different planes with respect to each other, depending on the way in which the leads 104 are bent, but in each case the bottom surface 122 of no lead 104 terminates outside the mold compound 102 in a plane below the bottom main surface 110 of the mold compound 102. This way, the height tolerance T_ld of the leads 104 has no impact on the overall height tolerance T_pkg of the molded semiconductor package 100.

According to the embodiment shown in FIG. 1, the bottom surface 122 of each lead 104 of the molded semiconductor package 100 is vertically offset from the bottom main surface 110 of the mold compound 102 by a distance d>0. In an embodiment, d ranges from 0.01 µm to 0.16 µm. According to the embodiment with the vertical offset, the bottom surface 122 of each package lead 104 is disposed in a plane (Plane A') above the bottom main surface 110 of the mold compound 102, e.g., as shown in FIG. 1.

Figure 2:
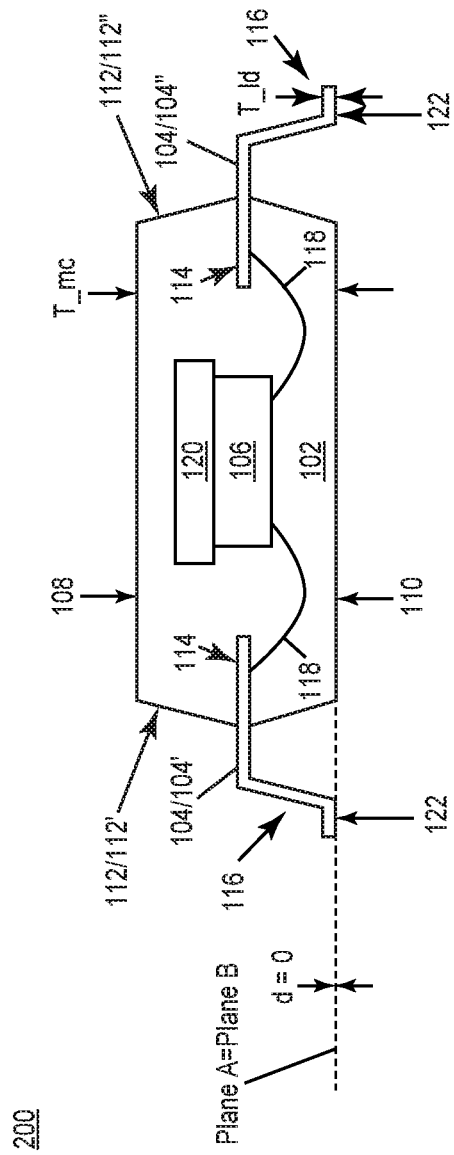
FIG. 2 illustrates a cross-sectional view of another embodiment of a molded semiconductor package of the leaded type and having a negative lead standoff.

FIG. 2 illustrates another embodiment of a molded semiconductor package 200 having a negative standoff between the leads 104 and the bottom main surface 110 of the mold compound 102. The embodiment illustrated in FIG. 2 is similar to the embodiment illustrated in FIG. 1. Different, however, each lead 104 of the molded semiconductor package 200 illustrated in FIG. 2 terminates outside the mold compound 102 in the same plane (Plane A'=Plane B') in which the bottom main surface 110 of the mold compound 102 lies. Hence, there is no vertical offset (d=0) between the bottom surface 122 of each lead 104 of the molded semiconductor package 200 and the bottom main surface 110 of the mold compound 102 according to this embodiment.

Figure 3:
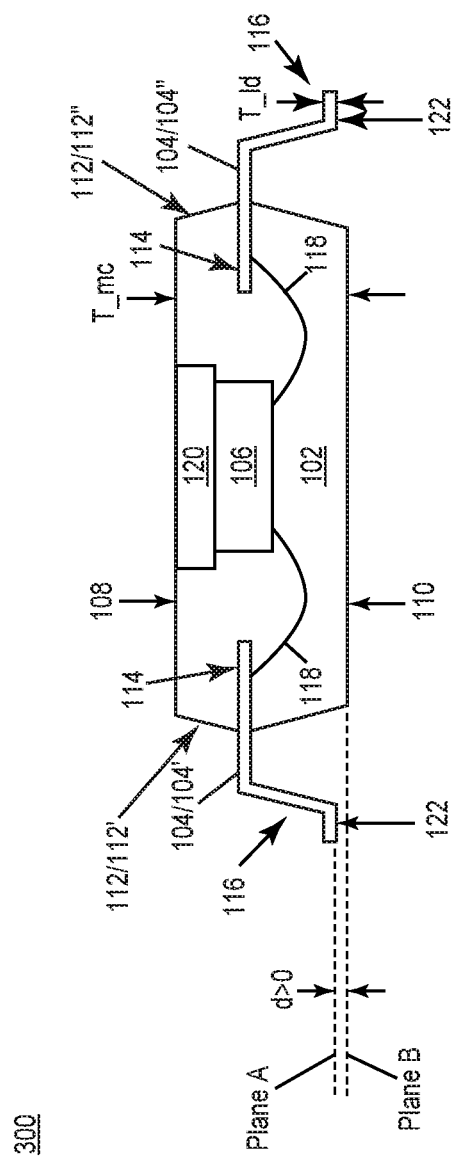
FIG. 3 illustrates a cross-sectional view of another embodiment of a molded semiconductor package of the leaded type and having a negative lead standoff.

FIG. 3 illustrates another embodiment of a molded semiconductor package 300 having a negative standoff between the leads 104 and the bottom main surface 110 of the mold compound 102. The embodiment illustrated in FIG. 3 is similar to the embodiment illustrated in FIG. 1. Different, however, the top main surface 108 of the mold compound 102 of the molded semiconductor package 300 illustrated in FIG. 3 is initially formed or later thinned so that the die pad 120 or similar structure to which the semiconductor die 106 is attached is exposed at the top side of the molded semiconductor package 300. If the semiconductor die 106 is not attached to a die pad of a lead frame or similar structure, the side of the semiconductor die 106 opposite the bottom main surface 110 of the mold compound 102 may be directly exposed at the top main surface 110 of the mold compound 102. In each case, a primary thermal path of the molded semiconductor package 300 may include the exposed die pad 120 at the top main surface 108 of the mold compound 102. As such, the embodiment illustrated in FIG. 3 reduces the thermal resistance of the primary thermal path of the molded semiconductor package 300 by exposing the die pad 120 or similar structure, or if a die pad/similar structure is not used, the side of the semiconductor die 106 opposite the bottom main surface 110 of the mold compound 102.

Figure 4:
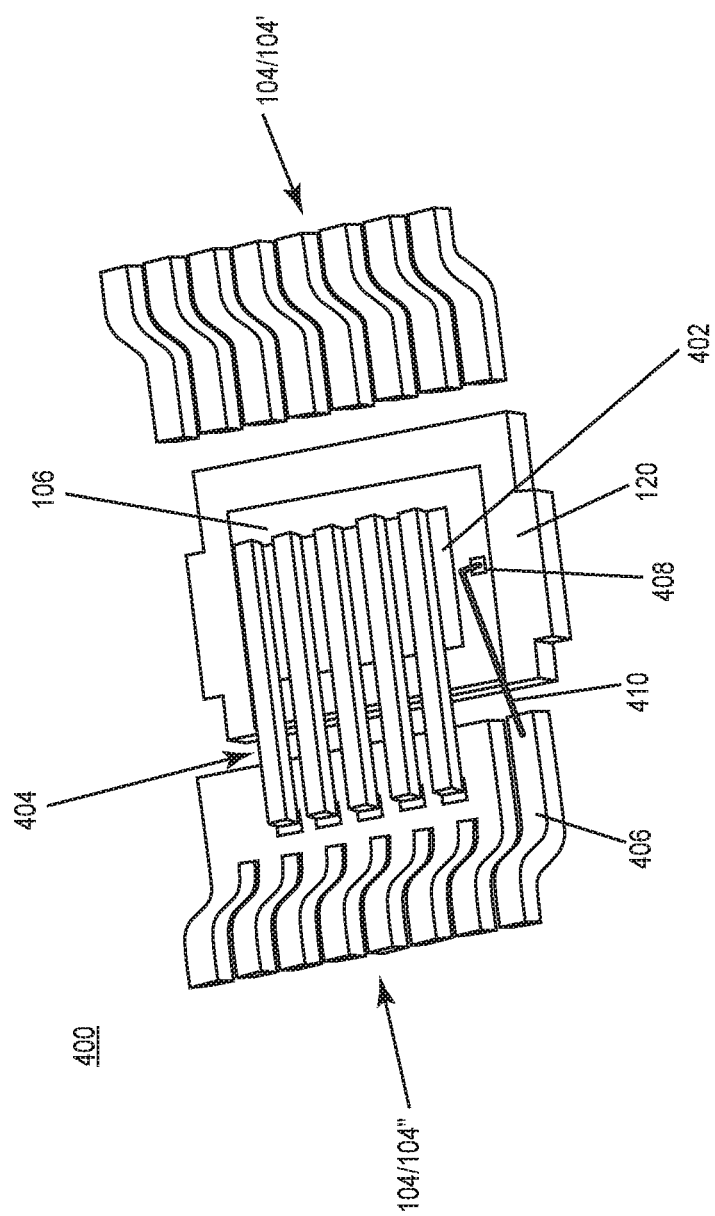
FIG. 4 illustrates a perspective view of an embodiment of a molded semiconductor package of the leaded type and having a negative lead standoff, but without the mold compound.

FIG. 4 illustrates a perspective view of an embodiment of a molded semiconductor package 400 having a negative standoff between the leads 104 and the bottom main surface 110 of the mold compound 102. The mold compound 102 is not visible in FIG. 4 so that the internal components of the package 400 are visible. According to this embodiment, the molded semiconductor package 400 is a dual row leaded flat package in which a first subset 104' of the leads 104 protrudes from a first side face of the mold compound (not shown in FIG. 4) and a second subset 104" of the leads 104 protrudes from a second side face of the mold compound opposite the first side face. In one embodiment, the semiconductor die 106 embedded in the mold compound is a power semiconductor device such as a power MOSFET (metal-oxide-semiconductor field effect transistor), IGBT (insulated gate bipolar transistor), HEMT (high-electron mobility transistor), etc.

In the case of a vertical power semiconductor device, the main current path is between the top and bottom sides of the die 106. In this case, a first load terminal (e.g. source or drain of a power MOSFET or HEMT; or emitter or collector of an IGBT) of the semiconductor die 106 is attached to the die pad of the lead frame 102 and out of view in FIG. 4, a second load terminal (e.g. drain or source of a power MOSFET or HEMT; or collector or emitter of an IGBT) 402 is disposed at the opposite side of the die 106. The first subset 104' of leads 104 may be integrally formed with the die pad 120 or may be separate.

In either case, the first subset 104' of leads 104 is electrically connected to the first load terminal of the semiconductor die 106. The second subset 104" of leads 104 is electrically connected to the second load terminal 402 of the semiconductor die 106, e.g., using a structured metal clip 404 as shown in FIG. 4. A third type of lead 406 is electrically connected to a gate terminal 408 of the semiconductor die 106 which is disposed at the same side of the die 106 as the second load terminal 402. The third type of lead 406 may be electrically connected to the gate terminal 408 of the semiconductor die 106 by a bond wire, metal clip or other type of electrical conductor 410. The semiconductor die 106 may instead be a lateral device in that the main current path is along the top side of the die 106. In this case, all power terminals of the semiconductor die 106 are disposed at the same side of the die which faces the bottom main surface 110 of the mold compound (not shown in FIG. 4).

Figure 5:
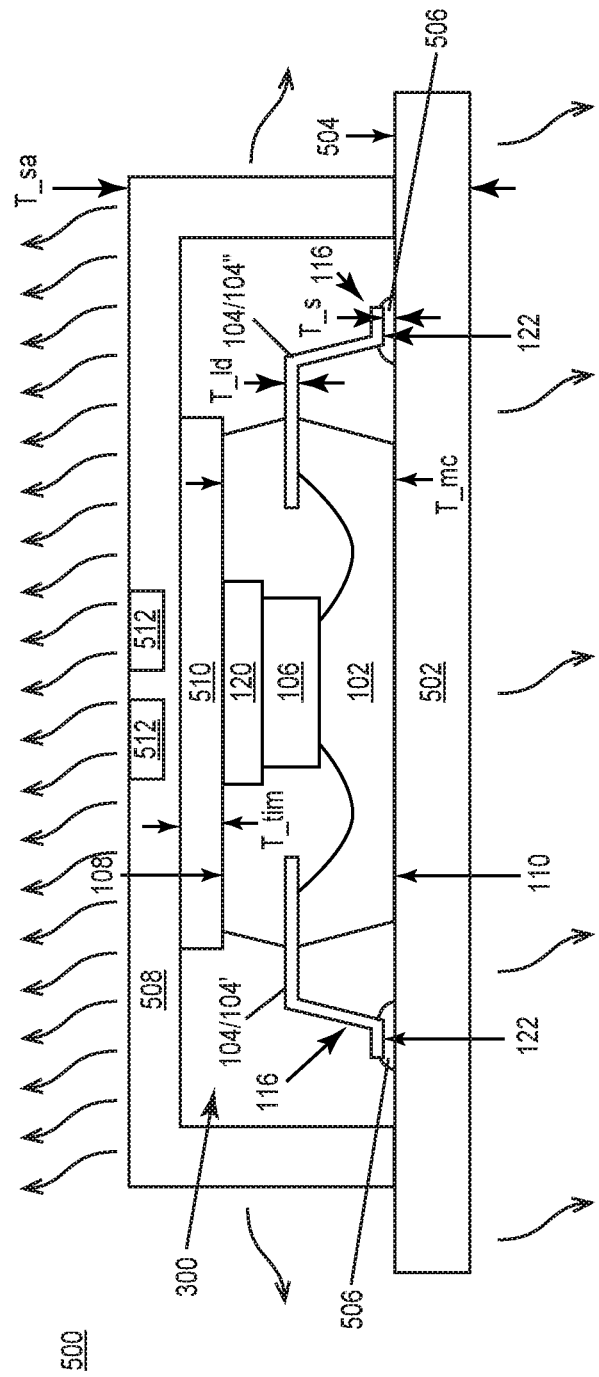
FIG. 5 illustrates a cross-sectional view of an embodiment of a semiconductor assembly that includes the molded semiconductor package shown in FIG. 3.

FIG. 5 illustrates a cross-sectional view of an embodiment of a semiconductor assembly 500 that includes a molded semiconductor package 300 of the kind described herein. The semiconductor assembly 500 may include any of the molded semiconductor packages 100/200/300/400 shown in FIGS. 1 through 4. For ease of explanation only, the semiconductor assembly 500 is shown in FIG. 5 with the molded semiconductor package 300 illustrated in FIG. 3.

The semiconductor assembly 500 also includes a circuit board 502 such as a PCB (printed circuit board) to which the molded semiconductor package 300 is mounted. The bottom main surface 110 of the package mold compound 102 faces the circuit board 502, and the top main surface 108 of the package mold compound 102 faces away from the circuit board 502. The second end 116 of the package leads 104 which protrude from one or more side faces of the mold compound 102 are attached to a first main surface 504 of the circuit board 502, e.g., by solder 506. The second end 116 of each lead 104 has a bottom surface 122 which faces the circuit board 502.

The bottom surface 122 of each package lead 104 is coplanar with the bottom main surface 110 of the mold compound 102 or disposed in a plane above which the bottom main surface 110 of the mold compound 102 lies as previously explained herein, so that no lead 104 of the molded semiconductor package 300 is positioned closer to the circuit board 502 than the mold compound 102. As previously described herein, the bottom surface 122 of each package lead 104 may be vertically offset from the bottom main surface 110 of the mold compound 102 by a distance ranging from 0.01 µm to 0.16 µm so that the bottom surface 122 of each package lead 104 is disposed in a plane above the bottom main surface 110 of the mold compound 102. Separately or in combination, each package lead 104 may be bent downward outside the mold compound 102 in a direction of the circuit board 502. In one embodiment, the bottom main surface 110 of the mold compound 102 contacts the first main surface 504 of the circuit board 502, e.g., as shown in FIG. 5.

In each case, the semiconductor assembly 500 also includes a cooling structure 508 disposed over the top main surface 108 of the package mold compound 102 and a thermal interface material (TIM) 510 such as TiN filling a gap between the top main surface 108 of the package mold compound 102 and the cooling structure 508. In the case of the second end 122 of each package lead 104 being attached to the first main surface 504 of the circuit board 502 by solder 506, the total height tolerance (T_sa) of the semiconductor assembly 500 includes the height tolerance (T_mc) of the package mold compound 102 between the top and bottom main surfaces 108, 110 of the mold compound 102, plus the height tolerance (T_s) of the solder 506, plus the height tolerance (T_cs) of the cooling structure 508, plus the height tolerance (T_tim) of the thermal interface material 510, but not the height tolerance (T_ld) of the package leads 104.

Figure 6:
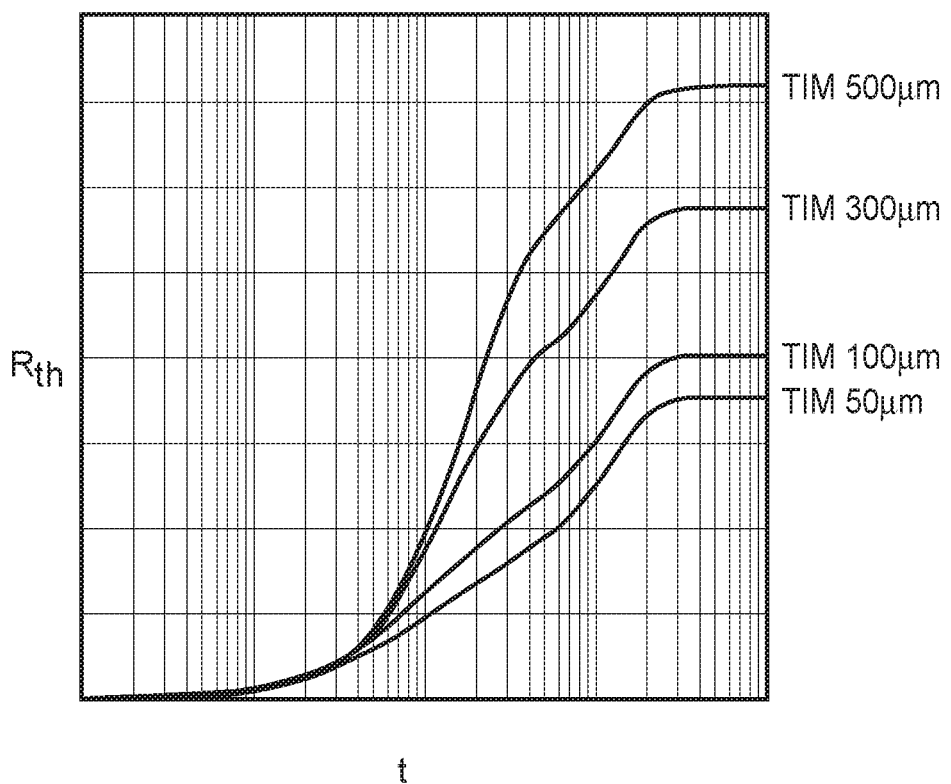
FIG. 6 plots thermal resistance of a thermal interface material over time for different material thicknesses.

FIG. 6 plots the thermal resistance ($R_{th}$) of the same thermal interface material (TIM) in °C./W over time (t) for different material thicknesses ranging from 50 µm to 500 µm. Once the semiconductor assembly 500 reaches a thermal steady-state, the advantage of a thinner thermal interface material 510 becomes readily apparent. In one embodiment, the thermal interface material 510 has a thickness of 100 um or less since the height tolerance T_ld of the package leads 104 is not a factor in determining the total height tolerance T_sa of the semiconductor assembly 500. Also, the robustness of the semiconductor assembly 500 is improved because any force acting on the semiconductor assembly 500, e.g., by the cooling structure 508, acts on the mold compound 102 of the molded semiconductor package 300 and not the package leads 104, the mold compound 102 being more robust than the package leads 104.

The height tolerance T_ld of the package leads 104 is not a factor in determining the total height tolerance T_sa of the semiconductor assembly 500 because the molded semiconductor package 300 has a negative standoff between the package leads 104 and the bottom main surface 110 of the mold compound 102, as explained above. The package leads 104 may still have some height tolerance, but the lead height tolerance does not contribute to the total height tolerance T_sa of the semiconductor assembly 500 because of the negative lead standoff. Hence, there may be a gap between the bottom surface 122 of some or all of the package leads 104 and the bottom main surface 110 of the mold compound 102, e.g., as shown in FIGS. 1 and 3. The solder 506 fills the gap between the circuit board 02 and the package leads 104, but the solder 506 does not affect the primary thermal path of the semiconductor assembly 500 which includes the exposed die pad 120 at the top main surface 108 of the mold compound 102, the thermal interface material 510 and the cooling structure 508. The primary thermal path of the semiconductor assembly 500 is indicated by the higher density of curvilinear lines at the top side of the cooling structure 508 in FIG. 5.

The cooling structure 508 of the semiconductor assembly 500 may include one or more water pipes or similar structures 512 for added cooling along the primary thermal path. In one embodiment, the cooling structure 508 is a housing attached to the first main surface 504 of the circuit board 502 and which encloses the molded semiconductor package 300 on the circuit board 502. In another embodiment, the cooling structure 508 is a heat slug, metal block or similar structure interposed between the top main surface 108 of the package mold compound 102 and another structure such as another circuit board, another semiconductor assembly, another semiconductor module, etc.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A molded semiconductor package, comprising:
a mold compound;
a plurality of leads, each lead of the plurality of leads having a first end embedded in the mold compound and a second end protruding from a side face of the mold compound; and
a semiconductor die embedded in the mold compound and electrically connected, within the mold compound, to the plurality of leads,
wherein the second end of each lead of the plurality of leads has a bottom surface facing in a same direction as a bottom main surface of the mold compound,
wherein the bottom surface of each lead of the plurality of leads is disposed in a plane above the bottom main surface of the mold compound so that no lead of the plurality of leads extends below the bottom main surface of the mold compound,
wherein the bottom surface of each lead of the plurality of leads is vertically offset from the bottom main surface of the mold compound by a distance of at least 0.01 µm so that the bottom surface of each lead of the plurality of leads is disposed in a plane above the bottom main surface of the mold compound.

2. The molded semiconductor package of claim 1, wherein each lead of the plurality of leads is bent downward outside the mold compound in a direction of the bottom main surface of the mold compound.

3. The molded semiconductor package of claim 1, wherein the second end of a first subset of leads of the plurality of leads protrude from a first side face of the mold compound, and wherein the second end of a second subset of leads of the plurality of leads protrude from a second side face of the mold compound opposite the first side face.

4. The molded semiconductor package of claim 1, wherein a primary thermal path of the molded semiconductor package includes an exposed pad at a top main surface of the mold compound opposite the bottom main surface of the mold compound.

5. A semiconductor assembly, comprising:
a circuit board;
a molded semiconductor package on the circuit board and comprising:
a mold compound having a bottom main surface facing the circuit board and a top main surface opposite the bottom main surface;
a plurality of leads, each lead of the plurality of leads having a first end embedded in the mold compound and a second end protruding from a side face of the mold compound and attached to a first main surface of the circuit board; and
a semiconductor die embedded in the mold compound and electrically connected, within the mold compound, to the plurality of leads,
wherein the second end of each lead of the plurality of leads has a bottom surface facing the circuit board,
wherein the bottom surface of each lead of the plurality of leads is disposed in a plane above the bottom main surface of the mold compound so that no lead of the plurality of leads is positioned closer to the circuit board than the mold compound;
a cooling structure disposed over the top main surface of the mold compound; and
a thermal interface material filling a gap between the top main surface of the mold compound and the cooling structure,
wherein the bottom surface of each lead of the plurality of leads is vertically offset from the bottom main surface of the mold compound by a distance of at least 0.01 µm so that the bottom surface of each lead of the plurality of leads is disposed in a plane above the bottom main surface of the mold compound.

6. The semiconductor assembly of claim 5, wherein the second end of each lead of the plurality of leads is attached to the first main surface of the circuit board by solder, and wherein a total height tolerance of the semiconductor assembly includes a height tolerance of the mold compound between the top and bottom main surfaces of the mold compound, a height tolerance of the solder, a height tolerance of the cooling structure, and a height tolerance of the thermal interface material but not a height tolerance of the plurality of leads.

7. The semiconductor assembly of claim 5, wherein the bottom main surface of the mold compound contacts the first main surface of the circuit board.

8. The semiconductor assembly of claim 5, wherein each lead of the plurality of leads is bent downward outside the mold compound in a direction of the circuit board.

9. The semiconductor assembly of claim 5, wherein the second end of a first subset of leads of the plurality of leads protrude from a first side face of the mold compound, and wherein the second end of a second subset of leads of the plurality of leads protrude from a second side face of the mold compound opposite the first side face.

10. The semiconductor assembly of claim 5, wherein a primary thermal path of the semiconductor assembly includes an exposed pad at the top main surface of the mold compound, the thermal interface material and the cooling structure.

11. The semiconductor assembly of claim 5, wherein the cooling structure is a housing attached to the first main surface of the circuit board and which encloses the molded semiconductor package on the circuit board.

12. The semiconductor assembly of claim 5, wherein the thermal interface material comprises TiN.

13. The semiconductor assembly of claim 5, wherein the thermal interface material has a thickness of 100 µm or less.

14. A molded semiconductor package, comprising:
a mold compound having a top main surface, a bottom main surface opposite the top main surface and a plurality of side faces extending between the top main surface and the bottom main surface;
a plurality of leads protruding from one or more side faces of the plurality of side faces of the mold compound; and
a semiconductor die embedded in the mold compound and electrically connected, within the mold compound, to the plurality of leads,
wherein each lead of the plurality of leads is bent downward in a direction away from the top main surface and toward the bottom main surface of the mold compound,
wherein each lead of the plurality of leads terminates outside the mold compound in a plane above the bottom main surface of the mold compound so that a total height tolerance of the molded semiconductor package includes a height tolerance of the mold compound between the top and bottom main surfaces but not a height tolerance of the plurality of leads,
wherein a bottom surface of each lead of the plurality of leads is vertically offset from the bottom main surface of the mold compound by a distance of at least 0.01 µm so that the bottom surface of each lead of the plurality of leads is disposed in a plane above the bottom main surface of the mold compound.

15. The molded semiconductor package of claim 14, wherein a primary thermal path of the molded semiconductor package includes an exposed pad at the top main surface of the mold compound.

16. A semiconductor assembly, comprising:

a circuit board;

a molded semiconductor package on the circuit board and comprising:

a mold compound having a bottom main surface facing the circuit board and a top main surface opposite the bottom main surface;

a plurality of leads, each lead of the plurality of leads having a first end embedded in the mold compound and a second end protruding from a side face of the mold compound and attached to a first main surface of the circuit board; and a semiconductor die embedded in the mold compound and electrically connected, within the mold compound, to the plurality of leads, wherein the second end of each lead of the plurality of leads has a bottom surface facing the circuit board, wherein the bottom surface of each lead of the plurality of leads is disposed in a plane above the bottom main surface of the mold compound so that no lead of the plurality of leads is positioned closer to the circuit board than the mold compound;

a cooling structure disposed over the top main surface of the mold compound; and a thermal interface material filling a gap between the top main surface of the mold compound and the cooling structure, wherein the thermal interface material has a thickness of 100 μm or less.

\* \* \* \* \*